US010505674B2

(12) United States Patent
Shen et al.

(10) Patent No.: US 10,505,674 B2
(45) Date of Patent: Dec. 10, 2019

(54) POLAR CODE GENERATION METHOD AND DEVICE

(71) Applicant: Huawei Technologies Co., Ltd., Shenzhen (CN)

(72) Inventors: Hui Shen, Shenzhen (CN); Bin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 176 days.

(21) Appl. No.: 15/659,026

(22) Filed: Jul. 25, 2017

(65) Prior Publication Data
US 2017/0324514 A1    Nov. 9, 2017

Related U.S. Application Data

(63) Continuation of application No. PCT/CN2015/071555, filed on Jan. 26, 2015.

(51) Int. Cl.
*H04L 1/00* (2006.01)

(52) U.S. Cl.
CPC .......... *H04L 1/0058* (2013.01); *H04L 1/0061* (2013.01); *H04L 1/0071* (2013.01)

(58) Field of Classification Search
CPC .............................. H03M 13/13; H04L 1/0058
See application file for complete search history.

(56) References Cited

U.S. PATENT DOCUMENTS

| 8,347,186 B1* | 1/2013 | Arikan | H03M 13/13 |
| | | | 714/774 |
| 9,304,859 B2* | 4/2016 | Aliev | G06F 11/108 |
| 9,317,365 B2* | 4/2016 | Alhussien | H03M 13/13 |
| 2015/0078486 A1 | 3/2015 | Wang et al. | |
| 2015/0091742 A1* | 4/2015 | Ionita | H03M 5/18 |
| | | | 341/57 |
| 2015/0092886 A1* | 4/2015 | Ionita | H04L 25/4917 |
| | | | 375/298 |
| 2016/0013887 A1 | 1/2016 | Shen et al. | |
| 2016/0079999 A1 | 3/2016 | Shen et al. | |
| 2016/0218743 A1 | 7/2016 | Li et al. | |

FOREIGN PATENT DOCUMENTS

| CN | 103023618 A | 4/2013 |
| CN | 103427943 A | 12/2013 |
| CN | 103825669 A | 5/2014 |
| CN | 104079370 A | 10/2014 |

(Continued)

OTHER PUBLICATIONS

M. Seidl, A. Schenk, C. Stierstorfer and J. B. Huber, "Aspects of Polar-Coded Modulation," SCC 2013; 9th International ITG Conference on Systems, Communication and Coding, München, Deutschland, 2013.*

(Continued)

*Primary Examiner* — Steve N Nguyen

(74) *Attorney, Agent, or Firm* — Slater Matsil, LLP

(57) ABSTRACT

A polar code generation method and device are disclosed. The method includes: determining an index set of information bits of a polar code according to a first modulation scheme; and encoding the polar code according to the index set of the information bits of the polar code.

10 Claims, 7 Drawing Sheets

(56) References Cited

FOREIGN PATENT DOCUMENTS

CN   104219019 A   12/2014
WO   2013174093 A1   11/2013

OTHER PUBLICATIONS

Cadambe, V.R. et al., "Interference Alignment and Spatial Degrees of Freedom for the K User Interference Channel," IEEE International Conference on Communications, May 19-23, 2008, pp. 971-975.

Ionita, C.I. et al., "On the Design of Binary Polar Codes for High-Order Modulation," 2014 IEEE Global Communications Conference, Dec. 9, 2014, pp. 3507-3512.

Shin, D-M. et al., "Mapping Selection and Code Construction for 2m-ary Polar-Coded Modulation," IEEE Communications Letters, vol. 16, No. 6, Jun. 2012, pp. 905-908.

\* cited by examiner

POLAR CODE GENERATION METHOD AND DEVICE

CROSS-REFERENCE TO RELATED APPLICATIONS

This application is a continuation of International Application No. PCT/CN2015/071555, filed on Jan. 26, 2015, the disclosure of which is hereby incorporated by reference in its entirety.

TECHNICAL FIELD

The present invention relates to the communications field, and more specifically, to a polar code generation method and device.

BACKGROUND

A communications system usually performs channel encoding to improve data transmission reliability and ensure communication quality. With a polar code, it is possible to can achieve Shannon capacity and have low encoding and decoding complexity. The polar code is a linear block code. A generation matrix of the polar code is $G_N$, and an encoding process of the polar code is $x_1^N = u_1^N G_N$. Herein, $G_N = B_N F^{\otimes n}$, a code length is $N=2^n$, and $n \geq 0$.

Herein, $$F = \begin{bmatrix} 1 & 0 \\ 1 & 1 \end{bmatrix},$$

and $B_N$ is a transposed matrix, such as a bit reversal matrix.

$F^{\otimes n}$ is a kronecker power of F, and is defined as follows: $F^{\otimes n} = F \otimes F^{\otimes (n-1)}$. The polar code may be represented as (N, K, A, $u_{A^c}$) using a coset code, and an encoding process of the polar code is $x_1^N = u_A G_N(A) \otimes u_{A^c} G_N(A^c)$ Herein, A is a set of information bit indexes, $G_N(A)$ is a submatrix of rows corresponding to the indexes in the set A in $G_N$, and $G_N(A^c)$ is a submatrix of rows corresponding to indexes in a set $A^c$ in $G_N$. $u_{A^c}$ is a frozen bit, a quantity of frozen bits is (N−K), and the frozen bits are known bits. For brevity, the frozen bits may be set to 0.

To make better use of bandwidth, improve a signal anti-noise capability, and the like, combining a polar code with higher order modulation gradually becomes a trend. However, in a higher order modulation scenario of the polar code, for example, when the polar code is combined with quadrature amplitude modulation (QAM), a multi-level encoding method needs to be used, that is, each level of higher order modulation corresponds to one binary polar code. That is, in the higher order modulation scenario, multiple encoders and decoders are required to complete encoding and decoding. In practice, it is difficult to use such a manner in which the polar code is combined with higher order modulation.

Therefore, how to improve polar code performance and encoding and decoding efficiency in a higher order modulation scenario has become an urgent problem to be resolved.

SUMMARY

Embodiments of the present invention provide a polar code generation method and device, so that polar code performance can be improved in a higher order modulation scenario.

According to a first aspect, a polar code generation method is provided, where a code length of a polar code is N, an information bit quantity of the polar code is K, the polar code is modulated using a first modulation scheme, N and K are integers greater than 0, and N is greater than K. The method includes: determining an index set of information bits of the polar code according to the first modulation scheme; and encoding the polar code according to the index set of the information bits of the polar code.

With reference to the first aspect, in a first implementation of the first aspect, the determining an index set of information bits of the polar code according to the first modulation scheme includes: determining K bit channels with a minimum error probability in N bit channels of the polar code according to the first modulation scheme; and determining the index set of the information bits of the polar code according to locations of the K bit channels with a minimum error probability.

With reference to the first aspect and the foregoing implementation of the first aspect, in a second implementation of the first aspect, the determining K bit channels with a minimum error probability in N bit channels of the polar code according to the first modulation scheme includes: determining multiple equivalent AWGN channels according to a modulation order of the first modulation scheme; performing simulation modulation and demodulation on at least one simulation data packet using the first modulation scheme, so as to determine a log-likelihood ratio (LLR) average of each of the multiple equivalent AWGN channels; initializing an LLR average corresponding to each of N code symbol bits that are obtained after modulation using the first modulation scheme, to obtain an initial value of the LLR average or an initial value of a probability density average of each code symbol bit; performing recursive update on an LLR average or a probability density average of each node in a factor graph of the polar code by means of Gaussian approximation calculation; determining, according to an updated LLR average or probability density average of each node in the factor graph of the polar code, an error probability of each of the N bit channels on which the polar code is transmitted; and determining the K bit channels with a minimum error probability according to the error probability of each of the N bit channels.

With reference to the first aspect and the foregoing implementations of the first aspect, in a third implementation of the first aspect, the performing recursive update on an LLR average or a probability density average of each node in a factor graph of the polar code by means of Gaussian approximation calculation includes the following formulas:

$$E[L_n^{(2i)}] = 2E[L_{n/2}^{(i)}]$$

$$E[L_n^{(2i-1)}] = \phi^{-1}\left(1 - (1 - \phi(E[L_{n/2}^{(i)}]))^2\right)$$

$$\phi(x) = \begin{cases} 1 - \dfrac{1}{\sqrt{4\pi x}} \int_{-\infty}^{+\infty} \tanh\dfrac{u}{2} e^{-\frac{(u-x)^2}{4x}} du & x > 0 \\ 1 & x = 0 \end{cases}$$

With reference to the first aspect and the foregoing implementations of the first aspect, in a fourth implementation of the first aspect, the determining an error probability of each of the N bit channels on which the polar code is transmitted includes the following formula:

$$p_i = Q(\sqrt{E[L_n^{(i)}]/2}), \quad 1 \leq i \leq n$$

With reference to the first aspect and the foregoing implementations of the first aspect, in a fifth implementation of the first aspect, interleaving is further performed on the polar code in a first interleaving mode, and the method further includes: determining the index set of the information bits of the polar code according to the first modulation scheme and the first interleaving mode.

With reference to the first aspect and the foregoing implementations of the first aspect, in a sixth implementation of the first aspect, the first modulation scheme is a higher order modulation scheme, and the polar code for which the first modulation scheme is used is a single polar code.

According to a second aspect, a polar code generation device is provided, where a code length of a polar code is N, an information bit quantity of the polar code is K, the polar code is modulated using a first modulation scheme, N and K are integers greater than 0, and N is greater than K. The device includes: a determining unit, configured to determine an index set of information bits of the polar code according to the first modulation scheme. The device also includes a generation unit, configured to encode the polar code according to the index set that is of the information bits of the polar code and that is determined by the determining unit.

With reference to the second aspect, in a first implementation of the second aspect, the determining unit is configured to: determine K bit channels with a minimum error probability in N bit channels of the polar code according to the first modulation scheme; and determine the index set of the information bits of the polar code according to locations of the K bit channels with a minimum error probability.

With reference to the second aspect and the foregoing implementation of the second aspect, in a second implementation of the second aspect, the device further includes a processing unit, and the determining unit is configured to: determine multiple equivalent AWGN channels according to a modulation order of the first modulation scheme; perform, using the processing unit, simulation modulation and demodulation on at least one simulation data packet using the first modulation scheme, so as to determine a log-likelihood ratio (LLR) average of each of the multiple equivalent AWGN channels; initialize, using the processing unit, an LLR average corresponding to each of N code symbol bits that are obtained after modulation using the first modulation scheme, to obtain an initial value of the LLR average or an initial value of a probability density average of each code symbol bit; perform, using the processing unit, recursive update on an LLR average or a probability density average of each node in a factor graph of the polar code by means of Gaussian approximation calculation; determine, according to an updated LLR average or probability density average of each node in the factor graph of the polar code, an error probability of each of the N bit channels on which the polar code is transmitted; and determine the K bit channels with a minimum error probability according to the error probability of each of the N bit channels.

With reference to the second aspect and the foregoing implementations of the second aspect, in a third implementation of the second aspect, the processing unit is configured to perform recursive update according to the following formulas:

$$E[L_n^{(2i)}] = 2E[L_{n/2}^{(i)}]$$

-continued $$E[L_n^{(2i-1)}] = \phi^{-1}(1 - (1 - \phi(E[L_{n/2}^{(i)}]))^2)$$

$$\phi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}$$

With reference to the second aspect and the foregoing implementations of the second aspect, in a fourth implementation of the second aspect, the determining unit is configured to determine the error probability of each bit channel according to the following formula:

$$p_i = Q(\sqrt{E[L_n^{(i)}]/2}, 1 \leq i \leq n$$

With reference to the second aspect and the foregoing implementations of the second aspect, in a fifth implementation of the second aspect, interleaving is further performed on the polar code in a first interleaving mode, and the determining unit is further configured to determine the index set of the information bits of the polar code according to the first modulation scheme and the first interleaving mode.

With reference to the second aspect and the foregoing implementations of the second aspect, in a sixth implementation of the second aspect, the first modulation scheme is a higher order modulation scheme, and the polar code for which the first modulation scheme is used is a single polar code.

In the embodiments of the present invention, an index set of information bits of a polar code whose code length is N and whose information bit quantity is K is determined according to a modulation scheme, and the polar code is encoded according to the index set of the information bits, so that polar code performance can be improved in a higher order modulation scenario.

BRIEF DESCRIPTION OF THE DRAWINGS

To describe the technical solutions in the embodiments of the present invention more clearly, the following briefly describes the accompanying drawings required for describing the embodiments of the present invention. Apparently, the accompanying drawings in the following description show merely some embodiments of the present invention, and a person of ordinary skill in the art may still derive other drawings from these accompanying drawings without creative efforts.

DETAILED DESCRIPTION OF ILLUSTRATIVE EMBODIMENTS

The following clearly describes the technical solutions in the embodiments of the present invention with reference to the accompanying drawings in the embodiments of the present invention. Apparently, the described embodiments are some rather than all of the embodiments of the present invention. All other embodiments obtained by a person of ordinary skill in the art based on the embodiments of the present invention without creative efforts shall fall within the protection scope of the present invention.

The embodiments of the present invention may be applied to various communications systems. Therefore, the following description is not limited to a specific communications system, such as a Global System for Mobile Communications (GSM), a Code Division Multiple Access (CDMA) system, a Wideband Code Division Multiple Access (WCDMA) system, a general packet radio service (GPRS) system, a Long Term Evolution (LTE) system, an LTE frequency division duplex (FDD) system, an LTE time division duplex (TDD) system, or a Universal Mobile Telecommunications System (UMTS). All information or data on which encoding processing is performed by a base station or a terminal in the foregoing system using a conventional turbo code and LDPC code can be encoded using a polar code in the embodiments.

Figure 1:
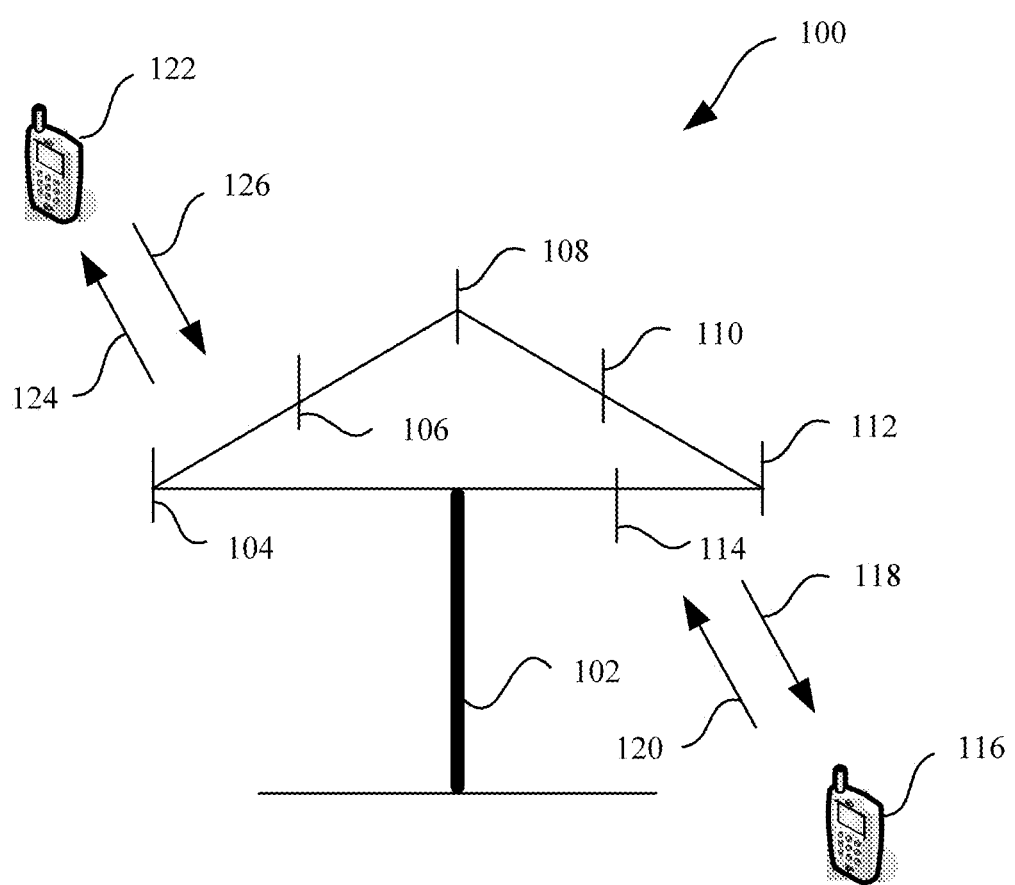
FIG. 1 shows a wireless communications system 100 according to embodiments of this specification.

FIG. 1 shows a wireless communications system 100 according to embodiments of this specification. The system 100 includes a base station 102, and the base station 102 may include multiple antenna groups. For example, one antenna group may include an antenna 104 and an antenna 106, another antenna group may include an antenna 108 and an antenna no, and an additional group may include an antenna 112 and an antenna 114. Two antennas are shown for each antenna group. However, each antenna group may have more antennas or fewer antennas. The base station 102 may additionally include a transmitter chain and a receiver chain. A person of ordinary skill in the art may understand that the transmitter chain and the receiver chain each may include multiple components (such as a processor, a modulator, a multiplexer, a demodulator, a demultiplexer, or an antenna) related to signal sending and receiving.

The base station 102 may communicate with one or more access terminals (such as an access terminal 116 and an access terminal 122). However, it may be understood that the base station 102 may communicate with almost any quantity of access terminals similar to the access terminal 116 and the access terminal 122. The access terminal 116 and the access terminal 122 may be, for example, cellular phones, smartphones, portable computers, handheld communications devices, handheld computing devices, satellite radio apparatuses, devices related to the Global Positioning System, PDAs, and/or any other appropriate devices used for communication in the wireless communications system 100. As shown in the figure, the access terminal 116 communicates with the antenna 112 and the antenna 114. The antenna 112 and the antenna 114 send information to the access terminal 116 using a forward link 118, and receive information from the access terminal 116 using a reverse link 120. In addition, the access terminal 122 communicates with the antenna 104 and the antenna 106. The antenna 104 and the antenna 106 send information to the access terminal 122 using a forward link 124, and receive information from the access terminal 122 using a reverse link 126. For example, in an FDD (frequency division duplex) system, the forward link 118 and the forward link 120 may use different frequency bands, and the forward link 124 and the reverse link 126 may use different frequency bands. In addition, in a TDD (time division duplex) system, the forward link 118 and the reverse link 120 may use a common frequency band, and the forward link 124 and the reverse link 126 may use a common frequency band.

Each antenna group and/or each area designed for communication are referred to as sectors of the base station 102. For example, the antenna group may be designed to communicate with an access terminal in a sector in a coverage area of the base station 102. During communication using the forward link 118 and the forward link 124, a transmit antenna of the base station 102 may increase signal-to-noise ratios of the forward link 118 for the access terminal 116 and the forward link 124 for the access terminal 122 by means of beamforming. In addition, compared with a case in which a base station performs sending to all access terminals of the base station using a single antenna, when the base station 102 performs, by means of beamforming, sending to the access terminal 116 and the access terminal 122 that are randomly scattered in the related coverage area, less interference is caused to a mobile device in a neighboring cell.

At a given time, the base station 102, the access terminal 116, and/or the access terminal 122 may be wireless communications sending apparatuses and/or wireless communications receiving apparatuses. When sending data, the wireless communications sending apparatus may encode the data for transmission. Specifically, the wireless communications sending apparatus may have (for example, generate, obtain, or save in a memory) a specific quantity of information bits that need to be sent to the wireless communications receiving apparatus using a channel. The information bits may be included in a transport block (or multiple transport blocks) of data, and the transport block may be segmented to generate multiple code blocks. In addition, the wireless communications sending apparatus may encode each code block using a polar code encoder (which is not shown), so as to improve data transmission reliability, thereby ensuring communication quality.

Figure 2:
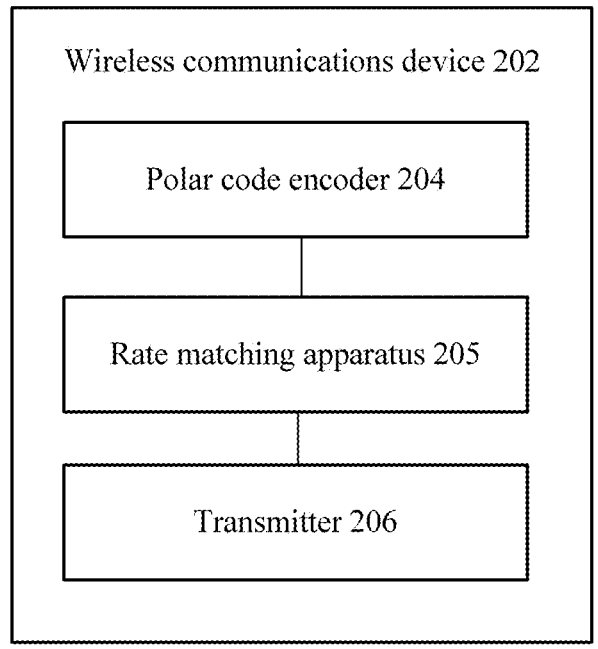
FIG. 2 shows a schematic block diagram of a system 200 that is used for a polar code generation method and that is applicable to the present invention in a wireless communication environment.

FIG. 2 shows a schematic block diagram of a system 200 that is used for a polar code generation method and that is applicable to the present invention in a wireless communication environment. The system 200 includes a wireless communications device 202, and the wireless communications device 202 is shown to send data using a channel. Although the wireless communications device 202 is shown to send data, the wireless communications device 202 may also receive data using a channel (for example, the wireless communications device 202 may simultaneously send and receive data, or the wireless communications device 202 may send and receive data at different moments, or a combination thereof). The wireless communications device 202 may be, for example, a base station (such as the base station 102 in FIG. 1) or an access terminal (such as the access terminal 116 in FIG. 1 or the access terminal 122 in FIG. 1).

The wireless communications device 202 may include a polar code encoder 204, a rate matching apparatus 205, and a transmitter 206. Optionally, when the wireless communications device 202 receives data via a channel, the wireless communications device 202 may further include a receiver. The receiver may exist independently, or may be integrated with the transmitter 206 to form a transceiver.

The polar code encoder 204 is configured to encode data that needs to be transferred by the wireless communications device 202, to obtain an encoded polar code.

In this embodiment of the present invention, the polar code encoder 204 is configured to: respectively map M reserved bits of broadcast signaling to M information bits with low reliability in K information bits of the polar code; map remaining bits of the broadcast signaling to remaining information bits in the K information bits, to obtain mapped bits, where M<K, and both M and K are positive integers; and perform polar code encoding on the mapped bits, to obtain coded bits that are obtained after encoding.

In addition, the transmitter 206 may subsequently transfer, on a channel, an output bit on which the rate matching apparatus 205 performs rate matching. For example, the transmitter 206 may send related data to another different wireless communications apparatus (which is not shown).

The following describes in detail a specific processing process of the foregoing polar code encoder. It should be noted that these examples are merely intended to help a person skilled in the art better understand the embodiments of the present invention, but are not intended to limit the scope of the embodiments of the present invention.

Figure 3:
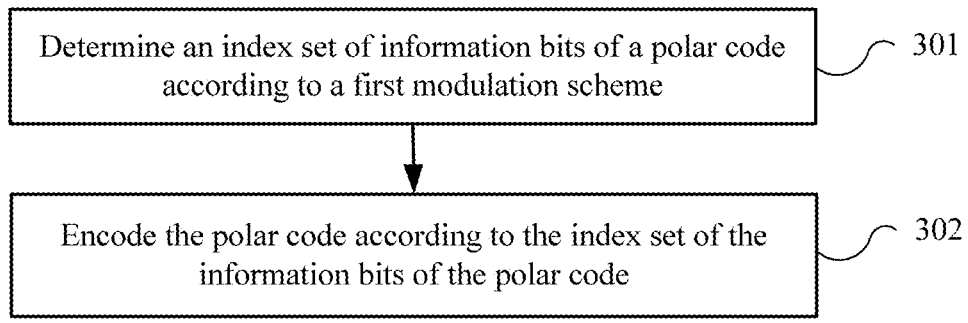
FIG. 3 is a flowchart of a polar code generation method according to an embodiment of the present invention.

FIG. 3 is a flowchart of a polar code generation method according to an embodiment of the present invention. The method in FIG. 3 may be executed by a polar code generation or encoding device at a data transmit end. The data transmit end may be further provided with a modulator that uses a first modulation scheme, and the first modulation scheme may be a higher order modulation scheme. A length of a polar code is N, an information bit quantity of the polar code is K, N and K are integers greater than 0, and N is greater than K.

301. Determine an index set of information bits of a polar code according to a first modulation scheme.

302. Encode the polar code according to the index set of the information bits of the polar code.

In this embodiment of the present invention, an index set of information bits of a polar code whose code length is N and whose information bit quantity is K is determined according to a modulation scheme, and the polar code is encoded according to the index set of the information bits, so that polar code performance can be improved in a higher order modulation scenario.

It should be understood that the polar code may be represented as (N, K, A, $u_{A^c}$) using a coset code, and an encoding process of the polar code is:

$$x_1^N = u_A G_N(A) \oplus u_{A^c} G_N(A^C) \quad (1);$$

where A is the index set of the information bits in step 301 (or a set of information bit indexes). $G_N(A)$ is a submatrix of rows corresponding to the indexes in the set A in $G_N$, and $G_N(A^C)$ is a submatrix of rows corresponding to indexes in a set $A^C$ in $G_N$. $u_{A^c}$ a frozen (frozen) bit, a quantity of frozen bits is (N−K), and the frozen bits are known bits. For brevity, the frozen bits may be set to 0.

Spectrum utilization can be improved by means of higher order modulation. In a same bandwidth condition, an information rate of higher order modulation is higher than that of lower order modulation. Commonly used higher order modulation may include 8PSK, 16QAM, 64QAM, and the like. It should be understood that a specific manner and a specific modulation order of higher order modulation are not limited in this embodiment of the present invention. In an embodiment, the first modulation scheme in this embodiment of the present invention may be higher order modulation. In a scenario in which the polar code is combined with higher order modulation (the first modulation scheme), the index set A of the information bits of the polar code needs to be determined according to the first modulation scheme.

Optionally, in an embodiment, the determining an index set of information bits of a polar code according to a first modulation scheme includes: determining K bit channels with a minimum error probability in N bit channels of the polar code according to the first modulation scheme; and determining the index set of the information bits of the polar code according to locations of the K bit channels with a minimum error probability.

It should be understood that in this embodiment of the present invention, a correspondence between a modulation scheme and an index set of information bits of a polar code may be predetermined in an offline process. For example, index sets, which are corresponding to all modulation schemes in multiple modulation schemes, of information bits of polar codes with different code lengths N and different information bit quantities K may be determined. For example, a correspondence table shown in Table 1 may be offline determined.

TABLE 1

Correspondence Between a Modulation Scheme and an Index Set

| Modulation scheme | Code length N | Information bit quantity K | Index set of information bits |
|---|---|---|---|
| 16QAM | 512 | 256 | A1 |
| | 1024 | 512 | A2 |
| | ... | ... | ... |
| 64QAM | 512 | 256 | A5 |
| | 1024 | 512 | A6 |
| ... | ... | ... | A... |

Using the correspondence in Table 1, when a polar code is being encoded or a polar code is being generated, only a modulation scheme used for the polar code, and a code length N and an information bit quantity K of the polar code need to be determined, so that an index set of information bits of the polar code can be determined using the correspondence table. In this way, an encoding operation of the polar code can be completed according to the foregoing formula (1).

In addition, determining an index set of information bits of a polar code according to a modulation scheme may be completed by means of online operation before the polar code is encoded. Specifically, simulation operations of modulation and demodulation may be performed multiple times on one or more simulation data packets using the first modulation scheme; statistics about simulation results are collected to obtain an LLR average obtained after soft demodulation corresponding to the first modulation scheme; and then, K bit channels with a minimum error probability in N bit channels are obtained using a Gaussian approximation algorithm. In this way, the index set that is of the information bits of the polar code and that is corresponding to the first modulation scheme is obtained.

Optionally, in an embodiment, the determining K bit channels with a minimum error probability in N bit channels of the polar code according to the first modulation scheme includes: determining multiple equivalent additive white Gaussian Noise (AWGN) channels according to a modulation order of the first modulation scheme; performing simulation modulation and demodulation on at least one simulation data packet using the first modulation scheme, so as to determine a log-likelihood ratio (LLR) average of each of the multiple equivalent AWGN channels; initializing an LLR average corresponding to each of N code symbol bits that are obtained after modulation using the first modulation scheme, to obtain an initial value of the LLR average or an initial value of a probability density average of each code symbol bit; performing recursive update on an LLR average or a probability density average of each node in a factor graph of the polar code by means of Gaussian approximation calculation; determining, according to an updated LLR average or probability density average of each node in the factor graph of the polar code, an error probability of each of the N bit channels on which the polar code is transmitted; and determining the K bit channels with a minimum error probability according to the error probability of each of the N bit channels.

First, the multiple equivalent AWGN channels may be determined according to the modulation order M of the first modulation scheme, and it is assumed that all the parallel channels accord with Gaussian distribution. In addition, different equivalent AWGN channels have different signal-to-noise ratios. For example, 16QAM may be equivalent to two AWGN channels, and 64QAM may be equivalent to three AWGN channels.

Afterward, simulation processes such as modulation, transmission, and soft demodulation are performed on some different simulation data packets using the first modulation scheme, and statistics about the LLR average of each equivalent AWGN channel are collected according to simulation results. Specifically, QAM modulation is used as an example. A formula of calculating an LLR average may be as follows:

$$\tilde{L}_k(r) = \log\left\{\frac{\sum_{a \in \chi_{k,1}} \exp(-\gamma(r-a)^2)}{\sum_{a \in \chi_{k,0}} \exp(-\gamma(r-a)^2)}\right\}, \text{ and}$$

$$L_k(r) = \gamma\left[\min_{a \in \chi_{k,0}}\{(r-a)^2\} - \min_{a \in \chi_{k,1}}\{(r-a)^2\}\right];$$

where $$\gamma = \frac{1}{N_0}$$

is a signal-to-noise ratio $$\frac{E_S}{N_0}$$

of an equivalent AWGN channel.

After a simulation data packet is modulated using the first modulation scheme, N/M modulation symbols are generated (M is the modulation order of the first modulation scheme). QAM modulation and two equivalent AWGN channels are used as an example, and an obtained correspondence may be: for example, a first symbol bit is corresponding to a first equivalent AWGN channel, a second symbol bit is corresponding to a second equivalent AWGN channel, a third symbol bit is corresponding to the first equivalent AWGN channel, a fourth symbol bit is corresponding to the second equivalent AWGN channel, and so on. It should be understood that a specific correspondence depends on a specific modulation scheme (or a modulation scheme and a mapping manner), and no limitation is set herein.

The LLR average corresponding to each of the N code symbol bits that are obtained after modulation using the first modulation scheme is initialized to obtain the initial value of the LLR average or the initial value of the probability density average of each code symbol bit. The LLR average and the probability density average may be equivalently converted. The following mainly uses the LLR average for description.

Specifically, the LLR average corresponding to each code symbol bit may be initialized according to the following method:

The following formula is obtained by means of simulation statistics collection:

$$E[L_1^{(i)}(y_i)] = a_i$$

$$\varphi(x) = \begin{cases} 1 - \frac{1}{\sqrt{4\pi x}}\int_{-\infty}^{+\infty}\tanh\frac{u}{2}e^{-\frac{(u-x)^2}{4x}}du & x > 0 \\ 1 & x = 0 \end{cases}$$

Optionally, in an embodiment, the performing recursive update on an LLR average or a probability density average of each node in a factor graph of the polar code by means of Gaussian approximation calculation includes the following steps:

In this embodiment of the present invention, the LLR average or the probability density average is updated based on a theoretical Gaussian approximation assumption and according to a sequence and a structure that are the same as those for SC decoding. Specifically, two update formulas corresponding to SC decoding are as follows:

$$L_n^{(2i-1)}(y_1^n, \hat{u}_1^{2i-2}) =$$
$$2\tanh^{-1}\bigl(\tanh(L_{n/2}^{(i)}(y_1^{n/2}, \hat{u}_{1,e}^{2i-2} \oplus \hat{u}_{1,o}^{2i-2})/2) \times \tanh(L_{n/2}^{(i)}(y_{n/2+1}^n, \hat{u}_{1,e}^{2i-2})/2)\bigr),$$

$$L_n^{(2i)}(y_1^n, \hat{u}_1^{2i-1}) = L_{n/2}^{(i)}(y_{n/2+1}^n, \hat{u}_{1,e}^{2i-2}) + (-1)^{\hat{u}_{2i-1}}L_{n/2}^{(i)}(y_1^{n/2}, \hat{u}_{1,e}^{2i-2} \oplus \hat{u}_{1,o}^{2i-2}),$$

Re-description may be given as follows by means of convolution in an L domain and a G domain:

$$a_{2N}^{(2i)} = a_N^{(i)} * a_N^{(i)}, \; a_{2N}^{(2i-1)} = a_N^{(i)} \boxtimes a_N^{(i)}, \; a_1^{(i)} = a_W$$

Multidimensional convolution calculation needs to be performed when update is performed for each node by means of density evolution, this dimension is equivalent to a quantized interval quantity, and generally, a quantized interval quantity is relatively large if a corresponding code length is relatively long. Therefore, overall complexity is relatively high. However, in this embodiment, Gaussian approximation is used as a basis. Gaussian approximation assumes that probability density distribution in the foregoing process is Gaussian. Therefore, one-dimensional probability density convolution needs to be performed instead of multidimensional convolution.

A Gaussian approximation method is as follows.

It can be proved that LLRs accord with the following Gaussian distribution:

$$L_1^{(i)}(y_i) \in N\left(\frac{2}{\sigma_n^2}, \frac{4}{\sigma_n^2}\right)$$

By means of Gaussian approximation, a recursive rule of the LLR average is as follows.

It is assumed as follows:

$$\begin{cases} L_{n/2}^{(i)}\left(y_{1,}^{n/2} \hat{u}_{1,e}^{2i-2} \oplus \hat{u}_{1,o}^{2i-2}\right) = L_{n/2}^{(i)}(\text{up}) \\ L_{n/2}^{(i)}\left(y_{n/2+1}^{n}, \hat{u}_{1,e}^{2i-2}\right) = L_{n/2}^{(i)}(\text{down}) \end{cases}$$

$$E[L_n^{(2i-1)}] = \varphi^{-1}(1 - (1 - \varphi(E[L_{n/2}^{(i)}(\text{down})]))(1 - \varphi(E[L_{n/2}^{(i)}(\text{down})])))$$

$$E[L_n^{(2i)}] = E[L_{n/2}^{(i)}(\text{down})] + E[L_{n/2}^{(i)}(\text{down})]$$

Therefore, the following formulas are obtained:

$$E[L_n^{(2i)}] = 2E[L_{n/2}^{(i)}]$$

$$E[L_n^{(2i-1)}] = \phi^{-1}\left(1 - (1 - \phi(E[L_{n/2}^{(i)}]))^2\right)$$

$$\phi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}$$

Optionally, in an embodiment, the determining an error probability of each of the N bit channels on which the polar code is transmitted includes: determining, according to an updated LLR average and probability density average of each code symbol bit, the error probability of each of the N bit channels on which the polar code is transmitted. Specifically, using a procedure similar to that of SC decoding, an error probability of an $i^{th}$ bit channel may be calculated: $p_i = Q(\sqrt{E[L_n^{(i)}]}/2)$, $1 \leq i \leq n$. Afterward, the K bit channels with a minimum error probability are determined according to the error probability of each of the N bit channels, and the index set A that is corresponding to the first modulation scheme and that is of the information bits of the polar code whose code length is N and whose information bit quantity is K is determined according to the locations of the K bit channels.

Optionally, in an embodiment, interleaving is further performed on the polar code in a first interleaving mode, and the method further includes: determining the index set of the information bits of the polar code according to the first modulation scheme and the first interleaving mode. It should be understood that after the polar code is modulated using the first modulation scheme, if interleaving needs to be performed, a sequence of soft bits generated after demodulation is disrupted because of interleaving. Therefore, for an interleaving case, interleaving impact needs to be considered when K bit channels with a minimum error probability are determined by means of simulation statistics collection.

Optionally, in an embodiment, the first modulation scheme is a higher order modulation scheme, and the polar code for which the first modulation scheme is used is a single polar code. For a scenario in which a polar code is combined with higher order modulation, a single polar code corresponds to higher order modulation in this embodiment of the present invention. This is different from a case in which multiple polar codes correspond to higher order modulation.

In this embodiment of the present invention, for higher order modulation, a bit channel with a minimum error probability is determined by means of multiple times of simulation statistics collection, so that an index set of information bits of a polar code is determined, and the polar code is encoded according to the index set of the information bits, so that a generated polar code matches a corresponding higher order modulation scheme at a higher degree, and polar code performance can be improved in a higher order modulation scenario. In addition, because higher order modulation is not performed on multiple polar codes in parallel, and instead, a single polar code is combined with higher order modulation, encoding and decoding difficulty are reduced, and encoder and decoder complexity are relatively low.

Figure 4:
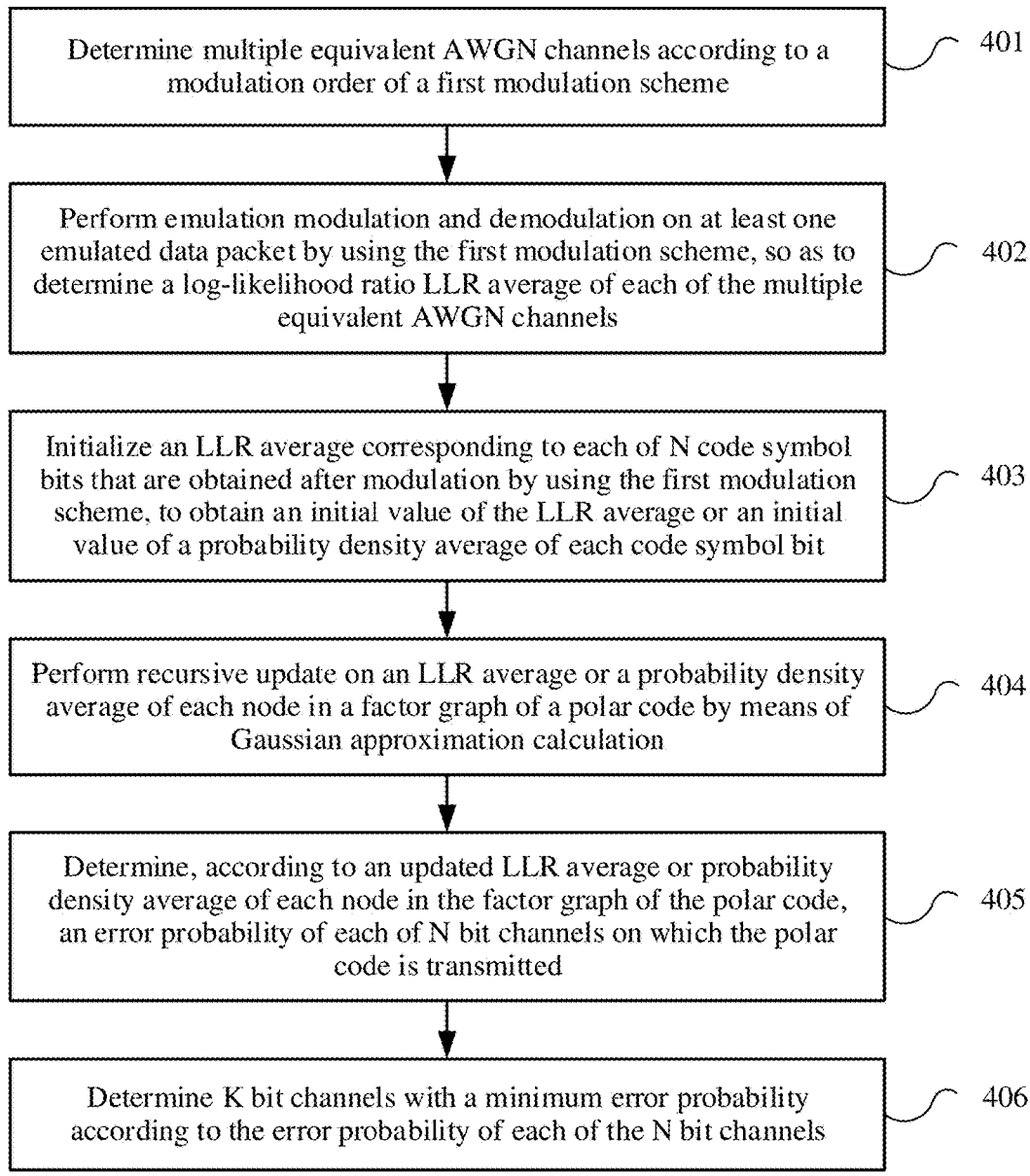
FIG. 4 is a flowchart of a polar code generation method according to an embodiment of the present invention.

FIG. 4 is a flowchart of a polar code generation method according to an embodiment of the present invention.

401. Determine multiple equivalent AWGN channels according to a modulation order of a first modulation scheme.

In a specific implementation, first, the multiple equivalent AWGN channels may be determined according to the modulation order of the first modulation scheme, and it is assumed that all the parallel channels accord with Gaussian distribution. In addition, different equivalent AWGN channels have different signal-to-noise ratios. For example, 16QAM may be equivalent to two AWGN channels, and 64QAM may be equivalent to three AWGN channels.

402. Perform simulation modulation and demodulation on at least one simulation data packet using the first modulation scheme, so as to determine a log-likelihood ratio (LLR) average of each of the multiple equivalent AWGN channels.

Simulation processes such as modulation, simulation transmission, and soft demodulation are performed on some different simulation data packets using the first modulation scheme, and the LLR average of each equivalent AWGN channel is calculated by means of statistics collection. Specifically, QAM modulation is used as an example:

$$\tilde{L}_k(r) = \log\left\{\frac{\sum_{a \in \chi_{k,1}} \exp(-\gamma(r-a)^2)}{\sum_{a \in \chi_{k,0}} \exp(-\gamma(r-a)^2)}\right\}, \text{ and}$$

$$L_k(r) = \gamma\left[\min_{a \in \chi_{k,0}}\{(r-a)^2\} - \min_{a \in \chi_{k,1}}\{(r-a)^2\}\right];$$

where $$\gamma = \frac{1}{N_0}$$

is a signal-to-noise ratio $$\frac{E_S}{N_0}$$

of an equivalent AWGN channel.

403. Initialize an LLR average corresponding to each of N code symbol bits that are obtained after modulation using the first modulation scheme, to obtain an initial value of the LLR average or an initial value of a probability density average of each code symbol bit.

After a simulation data packet is modulated using the first modulation scheme, N/M modulation symbols are generated (M is the modulation order of the first modulation scheme). 16QAM and two equivalent AWGN channels are used as an example, and an obtained correspondence may be: for example, a first symbol bit is corresponding to a first equivalent AWGN channel, a second symbol bit is corresponding to a second equivalent AWGN channel, a third symbol bit is corresponding to the first equivalent AWGN channel, a fourth symbol bit is corresponding to the second equivalent AWGN channel, and so on. It should be understood that a specific correspondence depends on a specific modulation scheme (or a modulation scheme and a mapping manner), and no limitation is set herein.

The LLR average corresponding to each of the N code symbol bits that are obtained after modulation using the first modulation scheme is initialized to obtain the initial value of the LLR average or the initial value of the probability density average of each code symbol bit. The LLR average and the probability density average may be equivalently converted. The following mainly uses the LLR average for description.

Specifically, the LLR average corresponding to each code symbol bit may be initialized according to the following method.

The following formula is obtained by means of simulation statistics collection:

$$E[L_1^{(i)}(y_i)] = a_i$$

404. Perform recursive update on an LLR average or a probability density average of each node in a factor graph of a polar code by means of Gaussian approximation calculation.

Optionally, in an embodiment, recursive update is performed on the LLR average or the probability density average of each node in the factor graph of the polar code by means of Gaussian approximation calculation. In this embodiment of the present invention, the LLR average or the probability density average is updated based on a theoretical Gaussian approximation assumption and according to a sequence and a structure that are the same as those for SC decoding. Specifically, two update formulas corresponding to SC decoding are as follows:

$$L_n^{(2i-1)}(y_1^n, \hat{u}_1^{2i-2}) =$$
$$2\tanh^{-1}(\tanh(L_{n/2}^{(i)}(y_1^{n/2}, \hat{u}_{1,e}^{2i-2} \oplus \hat{u}_{1,o}^{2i-2})/2) \times \tanh(L_{n/2}^{(i)}(y_{n/2+1}^n, \hat{u}_{1,e}^{2i-2})/2)),$$
$$L_n^{(2i)}(y_1^n, \hat{u}_1^{2i-1}) = L_{n/2}^{(i)}(y_{n/2+1}^n, \hat{u}_{1,e}^{2i-2}) + (-1)^{\hat{u}_{2i-1}} L_{n/2}^{(i)}(y_1^{n/2}, \hat{u}_{1,e}^{2i-2} \oplus \hat{u}_{1,o}^{2i-2}),$$

Re-description may be given as follows by means of convolution in an L domain and a G domain:

$$a_{2N}^{(2i)} = a_N^{(i)} * a_N^{(i)}, \; a_{2N}^{(2i-1)} = a_N^{(i)} \boxtimes a_N^{(i)}, \; a_1^{(i)} = a_W$$

Multidimensional convolution calculation needs to be performed when update is performed for each node by means of density evolution, this dimension is equivalent to a quantized interval quantity, and generally, a quantized interval quantity is relatively large if a corresponding code length is relatively long. Therefore, overall complexity is relatively high. However, in this embodiment, Gaussian approximation is used as a basis. Gaussian approximation assumes that probability density distribution in the foregoing process is Gaussian. Therefore, one-dimensional probability density convolution needs to be performed instead of multidimensional convolution.

A Gaussian approximation method is as follows.

It can be proved that LLRs or probability densities accord with the following Gaussian distribution:

$$L_1^{(i)}(y_i) \in N\left(\frac{2}{\sigma_n^2}, \frac{4}{\sigma_n^2}\right)$$

By means of Gaussian approximation, a recursive rule of the LLR average or the probability density average is as follows.

It is assumed as follows:

$$\begin{cases} L_{n/2}^{(i)}(y_{1,}^{n/2} \hat{u}_{1,e}^{2i-2} \oplus \hat{u}_{1,o}^{2i-2}) = L_{n/2}^{(i)}(\text{up}) \\ L_{n/2}^{(i)}(y_{n/2+1}^n, \hat{u}_{1,e}^{2i-2}) = L_{n/2}^{(i)}(\text{down}) \end{cases}$$

$$E[L_n^{(2i-1)}] =$$
$$\varphi^{-1}(1 - (1 - \varphi(E[L_{n/2}^{(i)}(\text{down})]))(1 - \varphi(E[L_{n/2}^{(i)}(\text{down})])));$$

where $$E[L_n^{(2i)}] = E[L_{n/2}^{(i)}(\text{down})] + E[L_{n/2}^{(i)}(\text{down})]$$

$$\varphi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}$$

Therefore, the following formulas are obtained:

$$E[L_n^{(2i)}] = 2E[L_{n/2}^{(i)}]$$

$$E[L_n^{(2i-1)}] = \phi^{-1}\left(1 - (1 - \phi(E[L_{n/2}^{(i)}]))^2\right)$$

$$\phi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}$$

405. Determine, according to an updated LLR average or probability density average, an error probability of each of N bit channels on which the polar code is transmitted. Specifically, using a procedure similar to that of SC decoding, an error probability of an $i^{th}$ bit channel may be calculated: $p_i = Q(\sqrt{E[L_n^{(i)}]}/2)$, $1 \leq i \leq n$.

406. Determine K bit channels with a minimum error probability according to the error probability of each of the N bit channels. When the error probability of each bit channel is obtained, the K bit channels with a minimum error probability may be determined, so that an index set A that is corresponding to the first modulation scheme and that is of information bits of the polar code whose code length is N and whose information bit quantity is K can be determined according to locations of the K bit channels.

In this embodiment of the present invention, for higher order modulation, a bit channel with a minimum error probability is determined by means of multiple times of simulation statistics collection, so that an index set of information bits of a polar code is determined, and the polar code is encoded according to the index set of the information bits, so that a generated polar code matches a corresponding higher order modulation scheme at a higher degree, and polar code performance can be improved in a higher order modulation scenario. In addition, because higher order modulation is not performed on multiple polar codes in parallel, and instead, a single polar code is combined with higher order modulation, encoding and decoding difficulty are reduced, and encoder and decoder complexity are relatively low.

Figure 5:
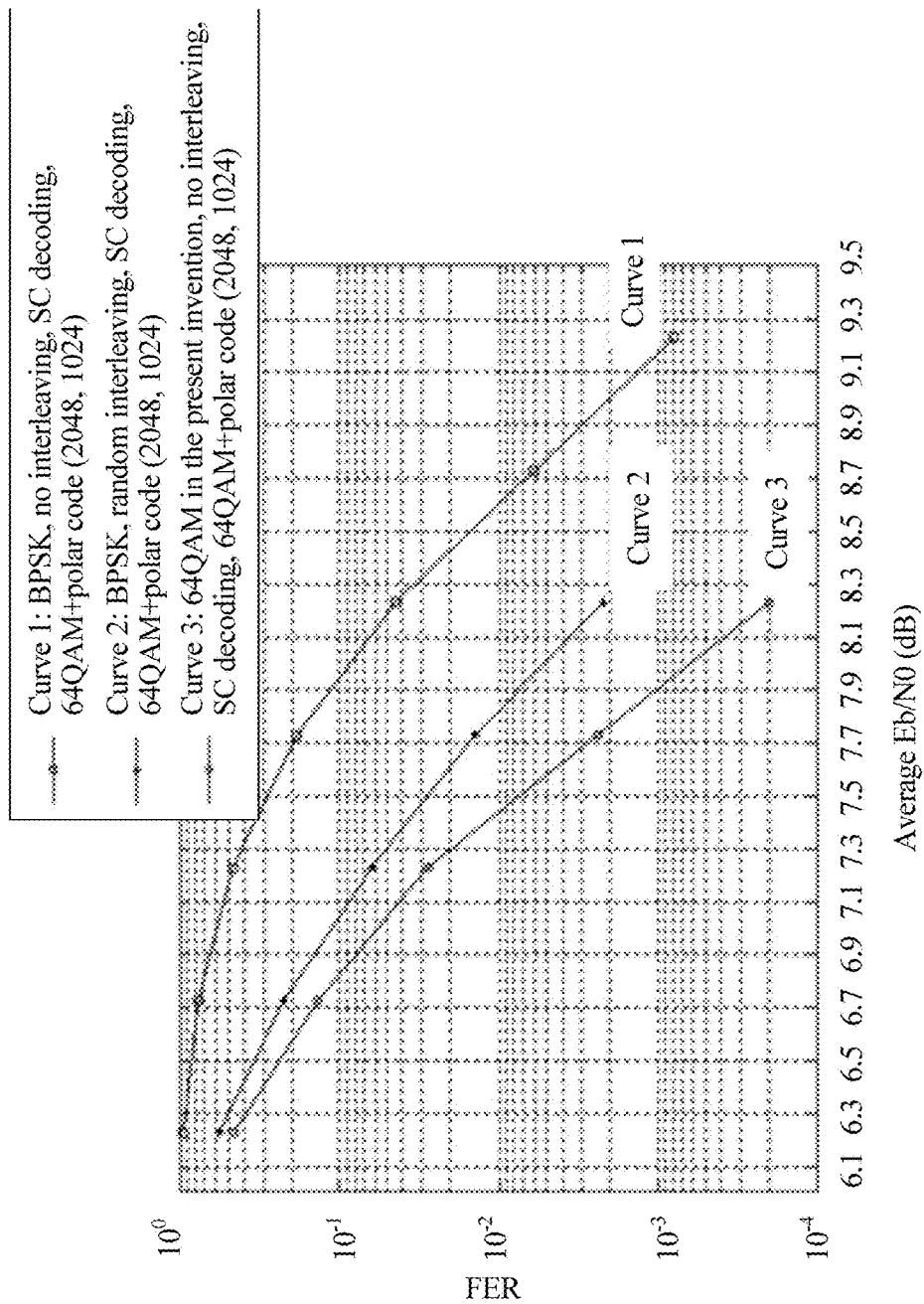
FIG. 5 is a curve diagram of a bit error rate of polar code decoding according to an embodiment of the present invention.

FIG. 5 is a curve diagram of a bit error rate of polar code decoding according to an embodiment of the present invention. A code length of a polar code is N=2048, an information bit quantity of the polar code is K=1024, a used modulation scheme is 64QAM, and a used decoding manner is SC decoding. A curve 1 is a curve of a bit error rate at which a polar code constructed based on BPSK is decoded in a case without random interleaving. A curve 2 is a curve of a bit error rate at which a polar code constructed based on BPSK is decoded in a random interleaving case. A curve 3 is a curve of a bit error rate at which a polar code constructed based on 64QAM in this embodiment of the present invention is decoded in a case without random interleaving. It may be learned that the polar code constructed based on 64QAM separately has 0.35-dB gains (compared with the polar code, constructed based on BPSK, in the random interleaving case) and 1.1-dB gains (compared with the polar code, constructed based on BPSK, in the case without random interleaving).

Figure 6:
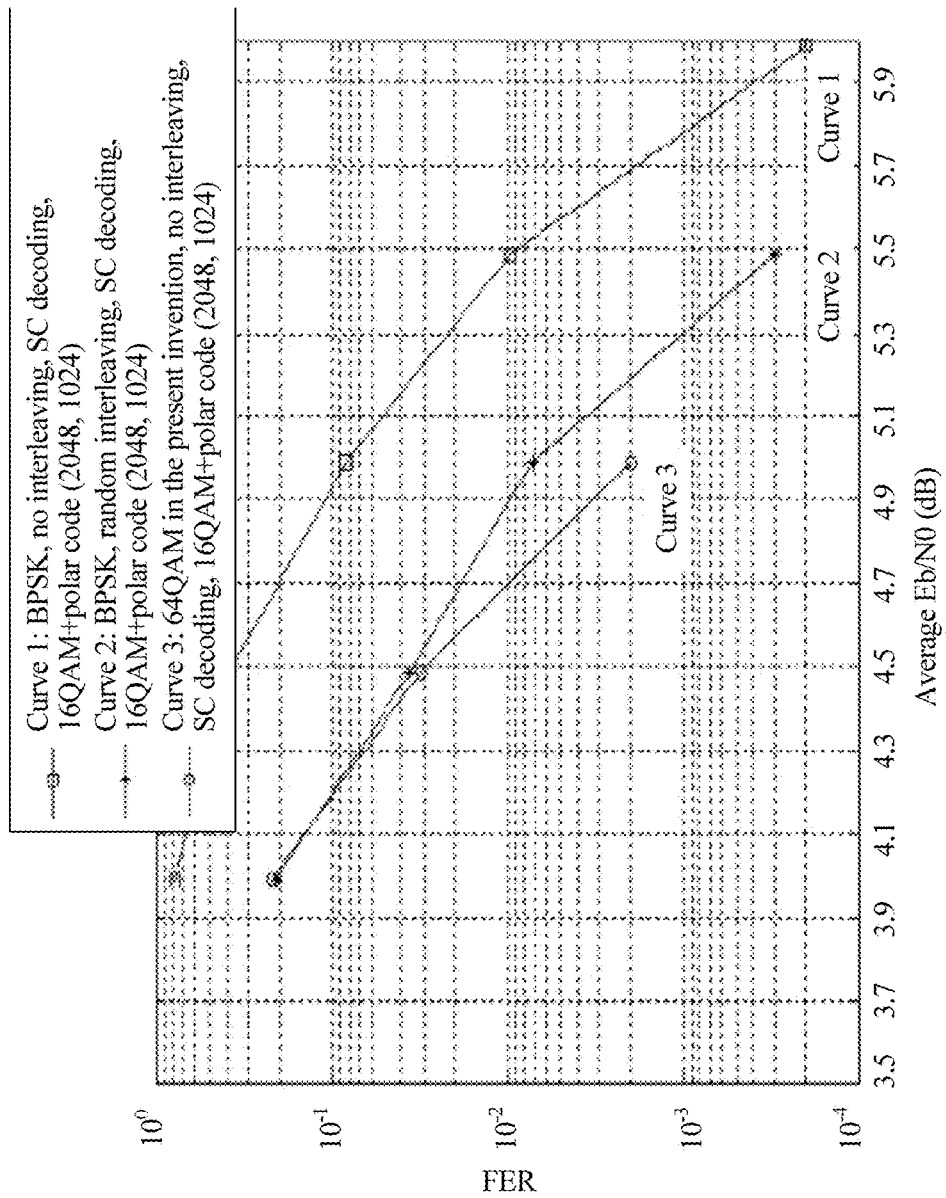
FIG. 6 is a curve diagram of a bit error rate of polar code decoding according to an embodiment of the present invention.

FIG. 6 is a curve diagram of a bit error rate of polar code decoding according to an embodiment of the present invention. A code length of a polar code is N=2048, an information bit quantity of the polar code is K=1024, a used modulation scheme is 16QAM, and a used decoding manner is SC decoding. A curve 1 is a curve of a bit error rate at which a polar code constructed based on BPSK is decoded in a case without random interleaving. A curve 2 is a curve of a bit error rate at which a polar code constructed based on BPSK is decoded in a random interleaving case. A curve 3 is a curve of a bit error rate at which a polar code constructed based on 16QAM is decoded in a case without random interleaving. It may be learned that the polar code constructed based on 16QAM separately has 0.2-dB gains (compared with the polar code, constructed based on BPSK, in the random interleaving case) and 0.8-dB gains (compared with the polar code, constructed based on BPSK, in the case without random interleaving).

Figure 7:
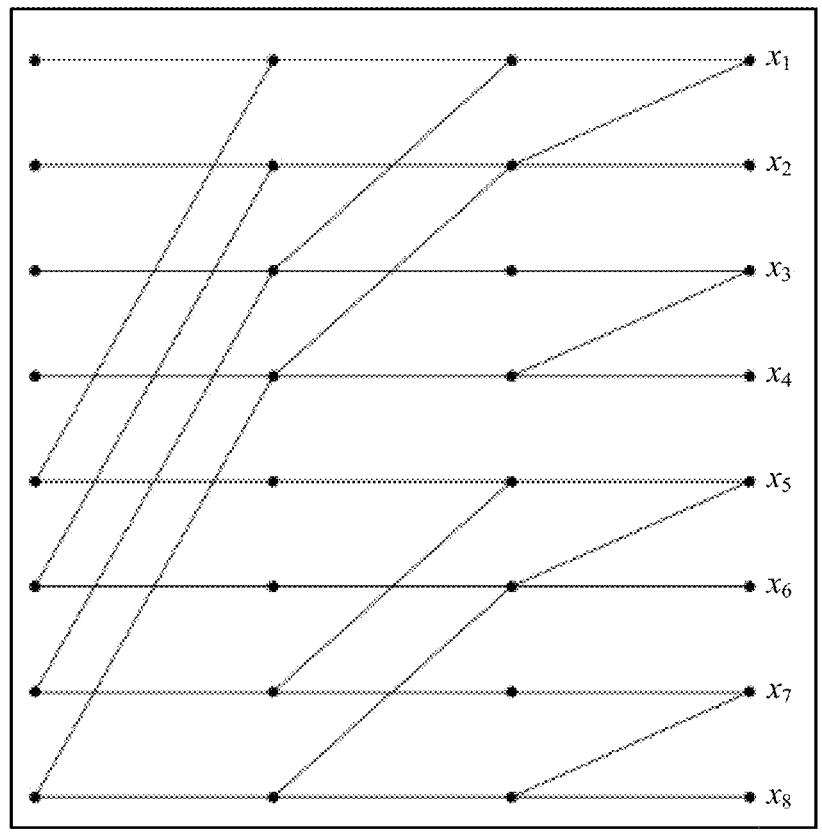
FIG. 7 is a factor graph of a polar code according to an embodiment of the present invention.

FIG. 7 is a factor graph of a polar code according to an embodiment of the present invention. FIG. 7 shows a factor graph of a polar code whose code length is N=8. In the factor graph, $x_1$ to $x_8$ indicate N=8 symbol bits, and each black dot in FIG. 7 is each node in the factor graph of the polar code.

Figure 8:
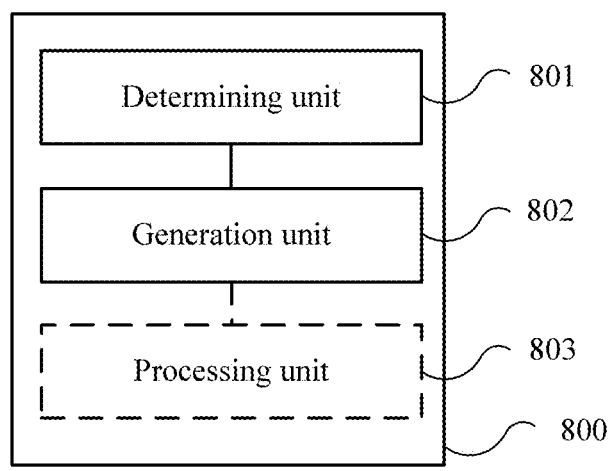
FIG. 8 is a schematic block diagram of a polar code generation device according to an embodiment of the present invention.

FIG. 8 is a schematic block diagram of a polar code generation device according to an embodiment of the present invention. A polar code generation device 800 shown in FIG. 8 may include a determining unit 801 and a generation unit 802. The device 800 may be further provided with a modulator that uses a first modulation scheme, or may be functionally connected to the modulator, and the first modulation scheme may be a higher order modulation scheme. A length of a polar code is N, an information bit quantity of the polar code is K, N and K are integers greater than 0, and N is greater than K.

The determining unit 801 determines an index set of information bits of the polar code according to the first modulation scheme, where the information bits are carried by K bit channels with a minimum error probability in N bit channels.

The generation unit 802 encodes the polar code according to the index set that is of the information bits of the polar code and that is determined by the determining unit 801.

The device 800 in this embodiment of the present invention can determine, according to a modulation scheme, an index set of information bits of a polar code whose code length is N and whose information bit quantity is K, and encode the polar code according to the index set of the information bits, so that polar code performance can be improved in a higher order modulation scenario.

It should be understood that the polar code may be represented as (N, K, A, $u_{A^c}$) using a coset code, and an encoding process of the polar code is: $x_1^N = u_A G_N(A) \oplus u_{A^c} G_N(A^C)$, where A is the index set of the information bits in step 301 (or a set of information bit indexes), and the set includes location indexes of the information bits of the polar code. $G_N(A)$ is a submatrix of rows corresponding to the indexes in the set A in $G_N$, and $G_N(A^C)$ is a submatrix of rows corresponding to indexes in a set $A^C$ in $G_N$. $u_{A^c}$ is a frozen (frozen) bit, a quantity of frozen bits is (N–K), and the frozen bits are known bits. For brevity, the frozen bits may be set to 0. That is, when a code length, an information bit quantity, and an index set of information bits of a to-be-generated/to-be-constructed polar code are determined, the polar code is determined, and an encoding process of the polar code is shown in the foregoing formula (1).

Spectrum utilization can be improved by means of higher order modulation. In a same bandwidth condition, an information rate of higher order modulation is higher than that of lower order modulation. Commonly used higher order modulation may include 8PSK, 16QAM, 64QAM, and the like. It should be understood that a specific manner and a specific modulation order of higher order modulation are not limited in this embodiment of the present invention. In a preferred embodiment, the first modulation scheme in this embodiment of the present invention may be higher order modulation. In a scenario in which the polar code is combined with higher order modulation (the first modulation scheme), the index set A of the information bits of the polar code needs to be determined according to the first modulation scheme.

Optionally, in an embodiment, the determining unit 801 is configured to: determine the K bit channels with a minimum error probability in the N bit channels of the polar code according to the first modulation scheme; and determine the index set of the information bits of the polar code according to locations of the K bit channels with a minimum error probability.

It should be understood that in this embodiment of the present invention, a correspondence between a modulation scheme and an index set of information bits of a polar code may be predetermined in an offline process. For example, index sets, which are corresponding to all modulation schemes in multiple modulation schemes, of information bits of polar codes with different code lengths N and different information bit quantities K may be determined.

In addition, determining an index set of information bits of a polar code according to a modulation scheme may be completed by means of online operation before the polar code is encoded. Specifically, simulation operations of modulation and demodulation may be performed multiple times on one or more simulation data packets using the first modulation scheme; and statistics about simulation results are collected, so as to determine K bit channels with a minimum error probability in N bit channels. In this way, the index set that is of the information bits of the polar code and that is corresponding to the first modulation scheme is obtained.

Optionally, in an embodiment, the device further includes a processing unit 803, and the determining unit 801 is configured to: determine multiple equivalent AWGN channels according to a modulation order of the first modulation scheme; perform, using the processing unit 803, simulation modulation and demodulation on at least one simulation data packet using the first modulation scheme, so as to determine a log-likelihood ratio (LLR) average of each of the multiple equivalent AWGN channels; initialize, using the processing unit 803, an LLR average corresponding to each of N code symbol bits that are obtained after modulation using the first modulation scheme, to obtain an initial value of a probability density average of each code symbol bit; perform, using the processing unit 803, recursive update on an initial value of a probability density average of each node in a factor graph of the polar code by means of Gaussian approximation calculation, where all the nodes in the factor graph of the polar code are in a one-to-one correspondence with all of the N code symbol bits; determine, according to an updated probability density average of each node in the factor graph of the polar code, an error probability of each of the N bit channels on which the polar code is transmitted; and determine the K bit channels with a minimum error probability according to the error probability of each of the N bit channels.

First, the multiple equivalent AWGN channels may be determined according to the modulation order M of the first modulation scheme, and it is assumed that all the parallel channels accord with Gaussian distribution. In addition, different equivalent AWGN channels have different signal-to-noise ratios. For example, 16QAM may be equivalent to two AWGN channels, and 64QAM may be equivalent to three AWGN channels.

Afterward, simulation processes such as modulation, transmission, and soft demodulation are performed on some different simulation data packets using the first modulation scheme, and statistics about the LLR average of each equivalent AWGN channel are collected according to simulation results.

After a simulation data packet is modulated using the first modulation scheme, N/M modulation symbols are generated (M is the modulation order of the first modulation scheme). QAM modulation and two equivalent AWGN channels are used as an example, and an obtained correspondence may be: for example, a first symbol bit is corresponding to a first equivalent AWGN channel, a second symbol bit is corresponding to a second equivalent AWGN channel, a third symbol bit is corresponding to the first equivalent AWGN channel, a fourth symbol bit is corresponding to the second equivalent AWGN channel, and so on. It should be understood that a specific correspondence depends on a specific modulation scheme (or a modulation scheme and a mapping manner), and no limitation is set herein.

The LLR average corresponding to each of the N code symbol bits that are obtained after modulation using the first modulation scheme is initialized to obtain the initial value of the probability density average (or the LLR average) of each code symbol bit.

Optionally, in an embodiment, the processing unit 803 is configured to perform recursive update according to the following formulas:

$$E[L_n^{(2i)}] = 2E[L_{n/2}^{(i)}]$$

$$E[L_n^{(2i-1)}] = \phi^{-1}\left(1 - (1 - \phi(E[L_{n/2}^{(i)}]))^2\right)$$

-continued $$\phi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}$$

Optionally, in an embodiment, the determining unit 801 is configured to determine the error probability of each bit channel according to the following formula:

$$p_i = Q(\sqrt{E[L_n^{(i)}]/2}), \quad 1 \leq i \leq n$$

Optionally, in an embodiment, interleaving is further performed on the polar code in a first interleaving mode, and the determining unit 801 is further configured to determine the index set of the information bits of the polar code according to the first modulation scheme and the first interleaving mode. It should be understood that after the polar code is modulated using the first modulation scheme, if interleaving needs to be performed, a sequence of modulation symbols generated after modulation is disrupted because of interleaving. Therefore, for an interleaving case, interleaving impact needs to be considered when K bit channels with a minimum error probability are determined by means of simulation statistics collection.

Optionally, in an embodiment, the first modulation scheme is a higher order modulation scheme, and the polar code for which the first modulation scheme is used is a single polar code. For a scenario in which a polar code is combined with higher order modulation, a single polar code corresponds to higher order modulation in this embodiment of the present invention. This is different from a case in which multiple polar codes correspond to higher order modulation.

For higher order modulation, the device 800 in this embodiment of the present invention determines a bit channel with a minimum error probability by means of multiple times of simulation statistics collection, so as to determine an index set of information bits of a polar code; and encodes the polar code according to the index set of the information bits, so that a generated polar code matches a corresponding higher order modulation scheme at a higher degree, and polar code performance can be improved in a higher order modulation scenario. In addition, because higher order modulation is not performed on multiple polar codes in parallel, and instead, a single polar code is combined with higher order modulation, encoding and decoding difficulty are reduced, and encoder and decoder complexity are relatively low.

Figure 9:
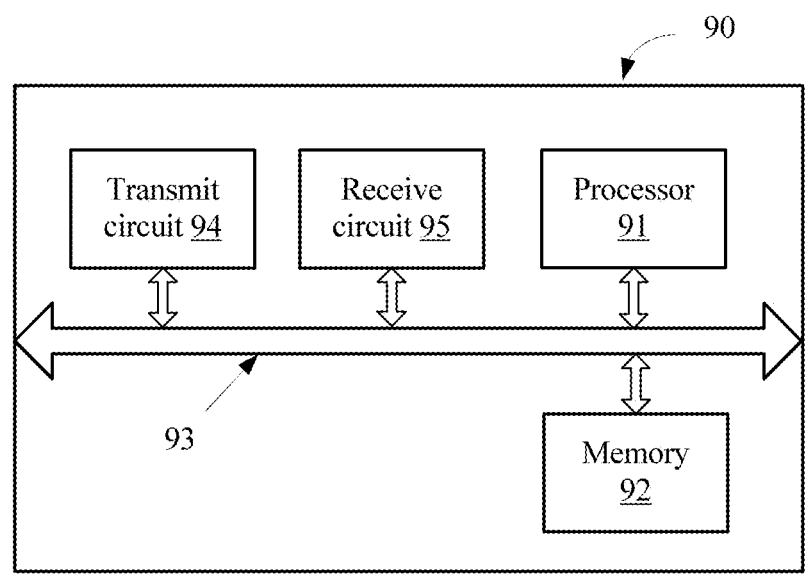
FIG. 9 is a schematic block diagram of a polar code generation device according to another embodiment of the present invention.

FIG. 9 is a schematic block diagram of a polar code generation device according to another embodiment of the present invention. A polar code generation device 90 in FIG. 9 includes a processor 91 and a memory 92. The processor 91 and the memory 92 are connected to each other using a bus system 93.

The memory 92 is configured to store instructions for enabling the processor 91 to perform the following operations: determining an index set of information bits of a polar code according to a first modulation scheme, where the information bits are carried by K bit channels with a minimum error probability in N bit channels; and encoding the polar code according to the index set of the information bits of the polar code.

The device 90 in this embodiment of the present invention can determine, according to a modulation scheme, an index set of information bits of a polar code whose code length is N and whose information bit quantity is K, where the information bits are carried by K bit channels with a minimum error probability in N bit channels; and encode the polar code according to the index set of the information bits, so that polar code performance can be improved in a higher order modulation scenario.

It should be understood that the polar code may be represented as (N, K, A, $u_{A^C}$) using a coset code, and an encoding process of the polar code is $x_1^N = u_A G_N(A) \oplus u_{A^C} G_N(A^C)$. Herein, A is a set of information bit indexes, $G_N(A)$ is a submatrix of rows corresponding to the indexes in the set A in $G_N$, and $G_N(A^C)$ is a submatrix of rows corresponding to indexes in a set $A^C$ in $G_N$. $u_{A^C}$ is a frozen (frozen) bit, a quantity of frozen bits is (N–K), and the frozen bits are known bits. For brevity, the frozen bits may be set to 0. The set of the information bit indexes may be determined according to the first modulation scheme, that is, the index set of the information bits of the polar code is determined.

Spectrum utilization can be improved by means of higher order modulation. In a same bandwidth condition, an information rate of higher order modulation is higher than that of lower order modulation. Commonly used higher order modulation may include 8PSK, 16QAM, 64QAM, and the like. It should be understood that a specific manner and a specific modulation order of higher order modulation are not limited in this embodiment of the present invention.

In addition, the device 90 may further include a transmit circuit 94, a receive circuit 95, and the like. The processor 91 controls an operation of the device 90, and the processor 91 may also be referred to as a CPU (Central Processing Unit). The memory 92 may include a read-only memory and a random access memory, and provide an instruction and data for the processor 91. A part of the memory 92 may further include a nonvolatile random access memory (NVRAM). All components of the device 90 are coupled together using the bus system 93. In addition to a data bus, the bus system 93 may include a power bus, a control bus, a status signal bus, and the like. However, for clarity of description, various buses are marked as the bus system 93 in the figure.

The method disclosed in the foregoing embodiment of the present invention may be applied to the processor 91, or implemented by the processor 91. The processor 91 may be an integrated circuit chip and has a signal processing capability. In an implementation process, the steps in the foregoing method may be completed using an integrated logic circuit of hardware in the processor 91 or an instruction in a form of software. The processor 91 may be a general purpose processor, a digital signal processor (DSP), an application-specific integrated circuit (ASIC), a field-programmable gate array (FPGA) or another programmable logic component, a discrete gate or a transistor logic device, or a discrete hardware component. The processor 91 may implement or perform the methods, the steps, and the logical block diagrams disclosed in the embodiments of the present invention. The general purpose processor may be a microprocessor, or the processor may be any conventional processor or the like. The steps of the methods disclosed in the embodiments of the present invention may be directly performed by a hardware decoding processor, or performed by a combination of hardware and software modules in a decoding processor. The software module may be located in a mature storage medium in the field, such as a random access memory, a flash memory, a read-only memory, a programmable read-only memory, an electrically-erasable programmable memory, or a register. The storage medium is located in the memory 92. The processor 91 reads information from the memory 92, and completes the steps of the foregoing method in combination with hardware in the memory 92.

Optionally, in an embodiment, the processor 91 is configured to: determine K bit channels with a minimum error probability in N bit channels of the polar code according to the first modulation scheme; and determine the index set of the information bits of the polar code according to locations of the K bit channels with a minimum error probability. It should be understood that in this embodiment of the present invention, a correspondence between a modulation scheme and an index set of information bits of a polar code may be predetermined in an offline process. For example, index sets, which are corresponding to all modulation schemes in multiple modulation schemes, of information bits of polar codes with different code lengths N and different information bit quantities K may be determined. In addition, determining an index set of information bits of a polar code according to a modulation scheme may be completed by means of online operation before the polar code is encoded. Specifically, simulation operations of modulation and demodulation may be performed multiple times on one or more simulation data packets using the first modulation scheme; and statistics about simulation results are collected, so as to determine K bit channels with a minimum error probability in N bit channels. In this way, the index set that is of the information bits of the polar code and that is corresponding to the first modulation scheme is obtained.

Optionally, in an embodiment, the processor 91 is configured to: determine multiple equivalent AWGN channels according to a modulation order of the first modulation scheme; perform simulation modulation and demodulation on at least one simulation data packet using the first modulation scheme, so as to determine a log-likelihood ratio (LLR) average of each of the multiple equivalent AWGN channels; initialize an LLR average corresponding to each of N code symbol bits that are obtained after modulation using the first modulation scheme, to obtain an initial value of a probability density average of each code symbol bit; perform recursive update on a probability density average of each node in a factor graph of the polar code by means of Gaussian approximation calculation, where all the nodes in the factor graph of the polar code are in a one-to-one correspondence with all the code symbol bits in the N symbol bits; determine, according to an updated probability density average of each node in the factor graph of the polar code, an error probability of each of the N bit channels on which the polar code is transmitted; and determine the K bit channels with a minimum error probability according to the error probability of each of the N bit channels.

For higher order modulation, the device 90 in this embodiment of the present invention determines a bit channel with a minimum error probability by means of multiple times of simulation statistics collection, so as to determine an index set of information bits of a polar code; and encodes the polar code according to the index set of the information bits, so that a generated polar code matches a corresponding higher order modulation scheme at a higher degree, and polar code performance can be improved in a higher order modulation scenario. In addition, because higher order modulation is not performed on multiple polar codes in parallel, and instead, a single polar code is combined with higher order modulation, encoding and decoding difficulty are reduced, and encoder and decoder complexity are relatively low.

The term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

It should be understood that sequence numbers of the foregoing processes do not mean execution sequences in various embodiments of the present invention. The execution sequences of the processes should be determined according to functions and internal logic of the processes, and should not be construed as any limitation on the implementation processes of the embodiments of the present invention.

A person of ordinary skill in the art may be aware that, in combination with the examples described in the embodiments disclosed in this specification, units and algorithm steps may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of the present invention.

It may be clearly understood by a person skilled in the art that, for the purpose of convenient and brief description, for a detailed working process of the foregoing system, apparatus, and unit, refer to a corresponding process in the foregoing method embodiments, and details are not described herein again.

In the embodiments provided in this application, it should be understood that the disclosed system, apparatus, and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual needs to achieve the objectives of the solutions of the embodiments.

In addition, functional units in the embodiments of the present invention may be integrated into one processing unit, or each of the units may exist alone physically, or two or more units are integrated into one unit.

When the functions are implemented in the form of a software functional unit and sold or used as an independent product, the functions may be stored in a computer-readable storage medium. Based on such an understanding, the technical solutions of the present invention essentially, or the part contributing to the prior art, or some of the technical solutions may be implemented in a form of a software product. The software product is stored in a storage medium, and includes instructions for instructing a computer device (which may be a personal computer, a server, or a network device) to perform all or some of the steps of the methods described in the embodiments of the present invention. The foregoing storage medium includes any medium that can store program code, such as a USB flash drive, a removable hard disk, a read-only memory (ROM), a random access memory (RAM), a magnetic disk, or an optical disc.

The foregoing descriptions are merely specific implementations of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A method comprising:
    modulating data, by a wireless communication device, according to a first modulation scheme;
    encoding, by the wireless communication device, the data according to a polar code, wherein an index set of information bits of the polar code according to the first modulation scheme is determined, and wherein the polar code is generated according to the index set of the information bits of the polar code,
    wherein a code length of the polar code is N and an information bit quantity of the polar code is K, N and K being integers greater than 0, and N being greater than K,
    wherein the index set of the information bits of the polar code is determined by determining K bit channels with a minimum error probability in N bit channels of the polar code according to the first modulation scheme and determining the index set of the information bits of the polar code according to locations of the K bit channels with the minimum error probability,
    wherein determining the K bit channels with the minimum error probability in the N bit channels of the polar code according to the first modulation scheme comprises:
        determining a plurality of equivalent additive white Gaussian Noise (AWGN) channels according to a modulation order of the first modulation scheme;
        performing simulation modulation and demodulation on a simulation data packet using the first modulation scheme, to determine a log-likelihood ratio (LLR) average of each of the plurality of equivalent AWGN channels;
        initializing an LLR average corresponding to each of N code symbol bits that are obtained after modulation using the first modulation scheme, to obtain an initial value of the LLR average or an initial value of a probability density average of each code symbol bit;
        performing recursive update on an LLR average or a probability density average of each node in a factor graph of the polar code by Gaussian approximation calculation;
        determining, according to the updated LLR average or the probability density average of each node in the factor graph of the polar code, an error probability of each of the N bit channels on which the polar code is transmitted; and
        determining the K bit channels with the minimum error probability according to the error probability of each of the N bit channels; and
    transmitting the encoded and modulated data.

2. The method according to claim 1, wherein performing the recursive update on the LLR average or the probability density average of each node in the factor graph of the polar code by the Gaussian approximation calculation comprises the following relations:

$$E[L_n^{(2i)}] = 2E[L_{n/2}^{(i)}]$$

$$E[L_n^{(2i-1)}] = \phi^{-1}\left(1 - (1 - \phi(E[L_{n/2}^{(i)}]))^2\right)$$

$$\phi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}.$$

3. The method according to claim 1, wherein determining the error probability of each of the N bit channels on which the polar code is transmitted comprises the following relation:

$$p_i = Q(\sqrt{E[L_n^{(i)}]/2}, \ 1 \le i \le n.$$

4. The method according to claim 1, wherein interleaving is further performed on the polar code in a first interleaving mode, and wherein the index set of the information bits of the polar code according to the first modulation scheme and the first interleaving mode is determined.

5. The method according to claim 1, wherein the first modulation scheme is a higher order modulation scheme, and the polar code for which the first modulation scheme is used is a single polar code.

6. A device comprising:
a processor; and
a computer-readable storage medium storing a program to be executed by the processor, the program including instructions for:
modulating data, by a wireless communication device, according to a first modulation scheme;
encoding, by the wireless communication device, the data according to a polar code,
wherein an index set of information bits of the polar code according to the first modulation scheme is determined,
wherein the polar code is generated according to the index set of the information bits of the polar code,
wherein a code length of the polar code is N and an information bit quantity of the polar code is K, N and K being integers greater than 0, and N being greater than K,
wherein the index set of the information bits of the polar code is determined by determining K bit channels with a minimum error probability in N bit channels of the polar code according to the first modulation scheme and determining the index set of the information bits of the polar code according to locations of the K bit channels with the minimum error probability,
wherein the instructions for determining the K bit channels with the minimum error probability in the N bit channels of the polar code according to the first modulation scheme comprises the instructions for:
determining a plurality of equivalent additive white Gaussian Noise (AWGN) channels according to a modulation order of the first modulation scheme;
performing simulation modulation and demodulation on a simulation data packet using the first modulation scheme, so as to determine a log-likelihood ratio (LLR) average of each of the plurality of equivalent AWGN channels;
initializing an LLR average corresponding to each of N code symbol bits that are obtained after modulation using the first modulation scheme, to obtain an initial value of the LLR average or an initial value of a probability density average of each code symbol bit;
performing recursive update on an LLR average or a probability density average of each node in a factor graph of the polar code by Gaussian approximation calculation;
determining, according to the updated LLR average or the probability density average of each node in the factor graph of the polar code, an error probability of each of the N bit channels on which the polar code is transmitted; and
determining the K bit channels with the minimum error probability according to the error probability of each of the N bit channels; and
transmitting the encoded and modulated data.

7. The device according to claim 6, wherein the program further includes instructions for performing the recursive update according to the following relations:

$$E[L_n^{(2i)}] = 2E[L_{n/2}^{(i)}]$$

$$E[L_n^{(2i-1)}] = \phi^{-1}\left(1 - (1 - \phi(E[L_{n/2}^{(i)}]))^2\right)$$

$$\phi(x) = \begin{cases} 1 - \frac{1}{\sqrt{4\pi x}} \int_{-\infty}^{+\infty} \tanh\frac{u}{2} e^{-\frac{(u-x)^2}{4x}} du & x > 0 \\ 1 & x = 0 \end{cases}.$$

8. The device according to claim 6, wherein the program further includes instructions for determining the error probability of each of the N bit channels on which the polar code is transmitted according to the following relation:

$$p_i = Q(\sqrt{E[L_n^{(i)}]/2}, \ 1 \le i \le n.$$

9. The device according to claim 6, further comprising instructions for:
performing interleaving on the polar code in a first interleaving mode; and
determining the index set of the information bits of the polar code according to the first modulation scheme and the first interleaving mode.

10. The device according to claim 6, wherein the first modulation scheme is a higher order modulation scheme, and the polar code for which the first modulation scheme is used is a single polar code.

* * * * *